US006780727B2

(12) United States Patent
Hwei et al.

(10) Patent No.: US 6,780,727 B2
(45) Date of Patent: Aug. 24, 2004

(54) METHOD FOR FORMING A MIM (METAL-INSULATOR-METAL) CAPACITOR

(75) Inventors: Ng Chit Hwei, Singapore (SG); Shao Kai, Singapore (SG); Bao Guang Wen, Shanghai (CN); Tjoa Tjin Tjin, Singapore (SG); Sanford Chu, Singapore (SG)

(73) Assignee: Chartered Semiconductor Manufacturing Limited, Singapore (SG)

(*) Notice: Subject to any disclaimer, the term of this patent is extended or adjusted under 35 U.S.C. 154(b) by 0 days.

(21) Appl. No.: 10/132,244

(22) Filed: Apr. 25, 2002

(65) Prior Publication Data

US 2003/0203584 A1 Oct. 30, 2003

(51) Int. Cl.[7] .......................................... H01L 21/8242

(52) U.S. Cl. ...................................... 438/393; 438/396

(58) Field of Search ................................ 438/386, 393, 438/396, 397

(56) References Cited

U.S. PATENT DOCUMENTS

| | | | | | |
|---|---|---|---|---|---|
| 6,171,899 | B1 | * | 1/2001 | Liou et al. | 438/393 |
| 6,300,240 | B1 | * | 10/2001 | Linliu et al. | 438/630 |
| 6,342,734 | B1 | * | 1/2002 | Allman et al. | 257/758 |
| 6,459,117 | B1 | * | 10/2002 | Liou | 257/306 |
| 6,576,526 | B2 | * | 6/2003 | Kai et al. | 438/393 |

* cited by examiner

*Primary Examiner*—Long Pham
*Assistant Examiner*—Anh Duy Mai

(57) ABSTRACT

Methods for forming a metal-insulator-metal (MIM) capacitor using an organic anti-reflective coating (ARC) are described. The first electrode of the MIM capacitor is formed from a first metal layer. The organic ARC is applied, and the second electrode of the MIM capacitor is formed from a second metal layer. The organic ARC is then removed using a nominal clean technique. Because the organic ARC is removed, the performance of the MIM capacitor is improved. Specifically, the breakdown voltage of the MIM capacitor increases and the leakage current decreases.

12 Claims, 17 Drawing Sheets

315

320

515

520

400

410
RECEIVE LAMINATE COMPRISING 1st AND 2nd METAL LAYERS SEPARATED BY A DIELECTRIC

420
FORM 1st ELECTRODE OF MIM CAPACITOR

430
APPLY ORGANIC ANTI-REFLECTIVE COATING TO THE 1st ELECTRODE AND 2nd METAL LAYER

440
FORM 2nd ELECTRODE OF MIM CAPACITOR

450
REMOVE ORGANIC ANTI-REFLECTIVE COATING

METHOD FOR FORMING A MIM (METAL-INSULATOR-METAL) CAPACITOR

TECHNICAL FIELD

The present invention relates to the fabrication of integrated circuits. More specifically, the present invention pertains to photolithography techniques for forming metal-insulator-metal (MIM) capacitors.

BACKGROUND ART

Photolithography techniques are used for fabricating components used in integrated circuits, such as metal-insulator-metal (MIM) capacitors (referred to also as metal-intermetal-metal capacitors). In the photolithography process, a pattern mask that defines the size and shape of a component (e.g., an electrode) in one layer of a MIM capacitor is applied to a photosensitive layer (e.g., photoresist) that has been applied over a metal layer. A stepper holds the pattern mask over the photoresist and projects the pattern image onto the photoresist through a lens. The pattern is imprinted into the photoresist; for example, the irradiated regions (e.g., the regions exposed through the pattern mask) are soluble in a specific solvent known as developer. The unexposed portions remain and thus the pattern is reproduced in the photoresist on the surface of the metal layer.

The portion of the metal layer not underlying the photoresist is then removed, usually by etching. The portion of the metal layer not removed will be in the shape of the component(s) defined by the pattern. This process is repeated as needed to build each layer of the MIM capacitor. A dielectric layer is present to separate the MIM capacitor electrodes.

Thus, the MIM capacitor is essentially built-up by forming a multitude of components in a number of layers, one layer on top of another. Because the components in one layer interconnect with components in other layers, it is necessary to ensure that the components are accurately positioned and formed. As components get even smaller, it is necessary to position and form components to increasingly finer tolerances.

Conventional techniques rely on accurate alignment of the stepper and its target in order to accurately form components. For geometries of 0.18 microns and less, accuracy is improved by applying an inorganic anti-reflective coating (ARC) such as silicon-oxy-nitride (SiON) to the metal layer prior to a stepper or scanner shot. The inorganic ARC reduces reflection from the metal layer, allowing the stepper or scanner to more accurately acquire the marks that are used to align the stepper (or scanner) and the target.

In the prior art, the inorganic ARC is not removed after the stepper or scanner shot because it cannot be easily removed by a post-masking etch or clean. The inorganic ARC thus remains a part of the MIM capacitor. However, the presence of the inorganic ARC in the MIM capacitor degrades the electrical performance of the capacitor. Specifically, the presence of the inorganic ARC reduces breakdown voltage and increases leakage current. For example, the breakdown voltage of a 400 Angstrom silane dioxide dielectric, using SiON as the inorganic ARC layer for the bottom electrode of a MIM capacitor, ranges from 26–32 volts.

Accordingly, what is needed is a method and/or system that can be used for fabricating MIM capacitors with improved electrical performance. For example, it is desirable to be able to fabricate MIM capacitors that have higher breakdown voltages and reduced leakage currents. It is also desirable to be able to fabricate MIM capacitors for which the variability of these parameters is reduced; that is, it is desirable for the range of values of breakdown voltage and leakage current to fall within a tighter tolerance band. The present invention provides a novel solution to these needs.

DISCLOSURE OF THE INVENTION

The present invention provides methods and systems thereof that can be used for fabricating MIM capacitors with improved electrical performance. For example, the present invention provides methods and systems for fabricating MIM capacitors that have higher breakdown voltages and reduced leakage currents. The present invention also provides methods and systems for fabricating MIM capacitors for which the variability of these parameters is reduced; that is, the range of values of breakdown voltage and leakage current falls within a tighter tolerance band.

The present embodiment of the present invention pertains to methods, and systems thereof, for forming a metal-insulator-metal (MIM) capacitor using an organic anti-reflective coating (ARC). The first electrode of the MIM capacitor is formed from a first metal layer. The organic ARC is applied, and the second electrode of the MIM capacitor is formed from a second metal layer. The organic ARC is then removed using a nominal clean technique.

According to the present invention, different types or brands of organic ARC can be used. In one embodiment, the organic ARC is AR2, and in another embodiment, the organic ARC is AR3. These or other types of organic ARC can be used interchangeably.

In one embodiment, the first and second metal layers are aluminum, and the dielectric separating the first and second electrodes is either silicon-nitrite or silicon-oxy-nitrite. In addition, a barrier layer can be disposed between the dielectric and each of the first and second metal layers. In one embodiment, the barrier layers are comprised of Ti-nitrite (TiN).

In one embodiment of a method for forming a MIM capacitor using organic ARC, a laminate that includes a first metal layer and a second metal layer separated by a dielectric and respective barrier layers is received by, for example, a stepper. A portion of the first metal layer and a portion of the dielectric (as well as the respective barrier layer) are removed to form the first electrode of the MIM capacitor. An organic ARC is applied to the first electrode and to the portion of the laminate exposed when the first metal layer and the dielectric were removed. A portion of the second metal layer and the respective barrier layer are removed to form the second electrode of the MIM capacitor. The remaining organic ARC is then removed (e.g., by cleaning).

In another embodiment of a method for forming a MIM capacitor using organic ARC, a first metal layer and a respective barrier layer are deposited on a substrate. A portion of the first metal layer (and the barrier layer) is removed to form the first electrode of the MIM capacitor. The dielectric and a second metal layer (and a respective barrier layer) are deposited on at least the first electrode. An organic ARC is applied to the resultant laminate, and a portion of the dielectric, the second metal layer and the respective barrier layer are removed to form the second electrode of the MIM capacitor. The remaining organic ARC is then removed (e.g., by cleaning).

In each of the embodiments described above, organic ARC can also be applied prior to formation of the first electrode.

Because the organic ARC is removed, the performance of the MIM capacitor is improved. Specifically, the breakdown voltage of the MIM capacitor increases and the leakage current decreases. In addition, the range of values for breakdown voltage and for leakage current is reduced, so that these parameters can be controlled within tighter tolerances.

These and other objects and advantages of the present invention will become obvious to those of ordinary skill in the art after having read the following detailed description of the preferred embodiments which are illustrated in the various drawing figures.

BRIEF DESCRIPTION OF THE DRAWINGS

The accompanying drawings, which are incorporated in and form a part of this specification, illustrate embodiments of the invention and, together with the description, serve to explain the principles of the invention.

BEST MODE FOR CARRYING OUT THE INVENTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well-known methods, procedures, components, and circuits have not been described in detail so as not to unnecessarily obscure aspects of the present invention.

Some portions of the detailed descriptions that follow are presented in terms of procedures, logic blocks, processing, and other symbolic representations of operations for fabricating metal-insulator-metal (MIM) capacitors. These descriptions and representations are the means used by those skilled in the art of MIM capacitor fabrication to most effectively convey the substance of their work to others skilled in the art. In the present application, a procedure, logic block, process, or the like, is conceived to be a self-consistent sequence of steps or instructions leading to a desired result. The steps are those requiring physical manipulations of physical quantities. Usually, although not necessarily, these quantities take the form of electrical or magnetic signals capable of being stored, transferred, combined, compared, and otherwise manipulated in a computer system to fabricate a MIM capacitor.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present invention, discussions utilizing terms such as "applying," "removing," "forming," "etching," "receiving," "depositing" or the like, refer to actions and processes (e.g., processes 400 and 600 of FIGS. 4 and 6, respectively) of MIM capacitor fabrication.

Figure 1:
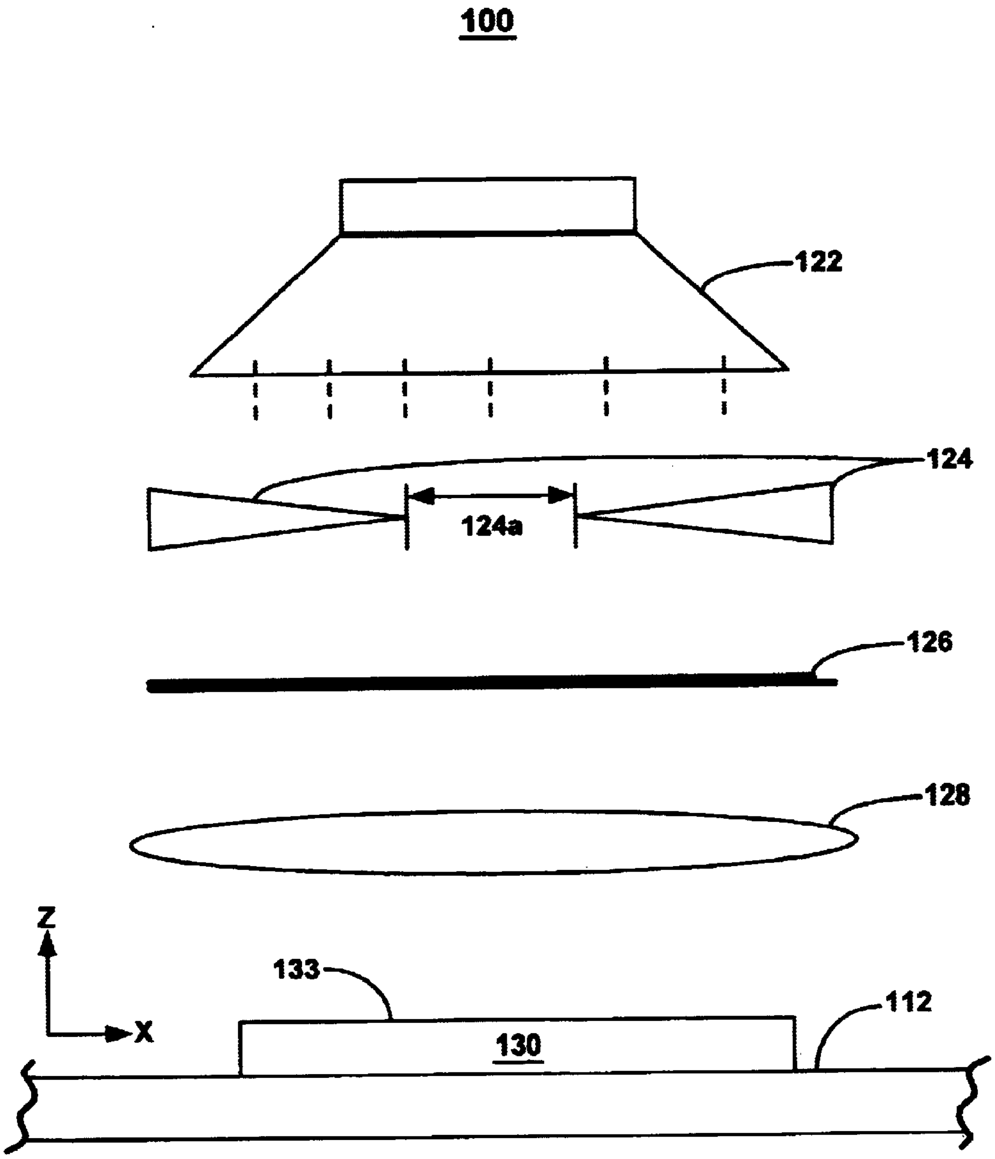
FIG. 1 is a side view of one embodiment of an exemplary stepper upon which embodiments of the present invention may be practiced.

FIG. 1 shows a side view of an exemplary stepper 100 upon which embodiments of the present invention may be practiced. Although a stepper is described herein, it is appreciated that lithography (photolithography) techniques can be implemented using other types of apparatus, such as a scanner. That is, embodiments of the present invention may be implemented on devices other than steppers.

In the present embodiment, stepper 100 includes a light source 122, masking blades 124, a pattern mask or reticle 126, a lens 128, and a stage 112. The light source 122 projects light through an opening 124*a* of masking blades 124, through the transparent portion of a pattern on reticle 126, through lens 128 and onto a metal layer 133 located on the stage 112. By doing so, the pattern of the reticle 126 is reproduced on the metal layer 133.

It is appreciated that the metal layer 133 may reside either directly on a wafer 130, on a passivation layer that has been deposited on the wafer 130, on another layer deposited on the wafer 130, on another component or device built on the wafer 130, or on some other substrate residing on wafer 130.

Figure 2:
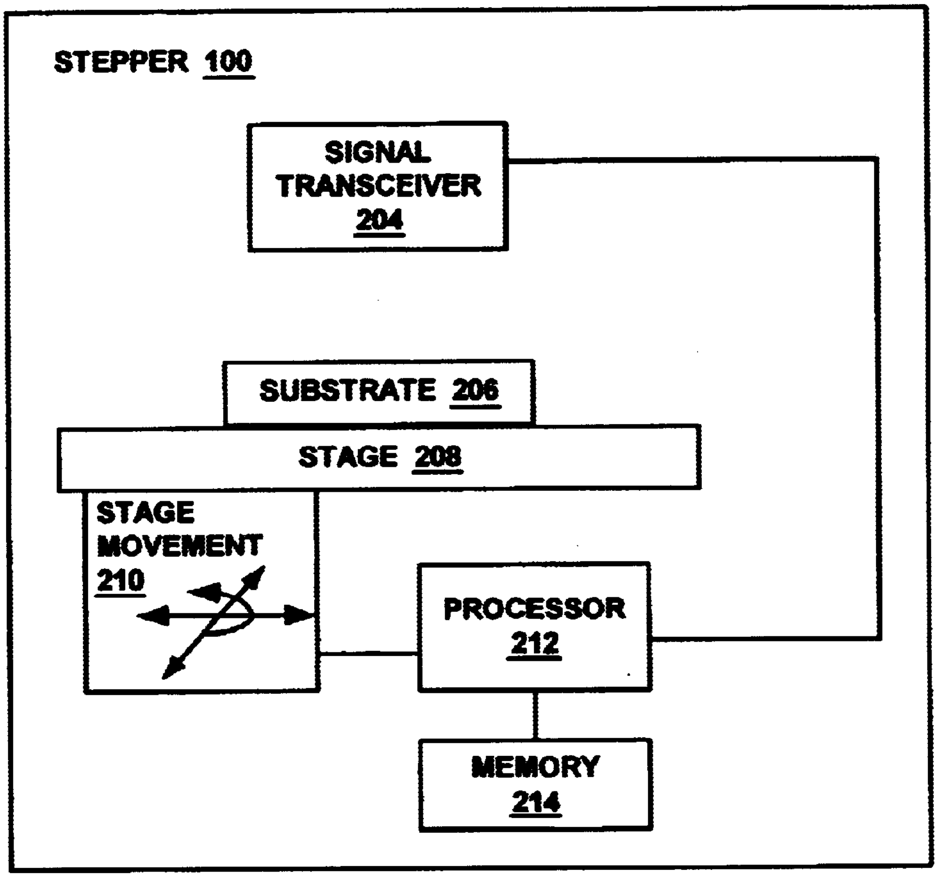
FIG. 2 is a block diagram of one embodiment of a stepper upon which embodiments of the present invention may be practiced.

FIG. 2 is a functional block diagram of a stepper 100 upon which embodiments of the present invention may be practiced. As described above, embodiments of the present invention may be implemented on devices other than steppers, such as scanners.

In the present embodiment, stepper 100 includes a stage 208 coupled to a stage movement device 210, a processor 212, a signal transceiver 204, and a memory 214. Substrate 206 is placed on stage 208 for processing in stepper 101; substrate 206 is typically a silicon wafer.

Memory 214 contains program instructions implemented through processor 212. Memory 214 can either be permanent memory, such as read only memory (ROM), or temporary memory, such as random access memory (RAM). Memory 214 can also be any other type of memory storage capable of containing program instructions, such as a hard drive, a CD ROM, or flash memory. Processor 212 can either be an existing system processor or microprocessor, a dedicated digital signal processing (DSP) processor unit, or a dedicated controller or microcontroller. Alternatively, the program instructions may be implemented using an implementation of a state machine.

Signal transceiver 204 is coupled to processor 212. Signal transceiver 204 is a source of an electromagnetic signal, such as a laser. Additionally, signal transceiver 204 is a receiver for an electromagnetic signal, such as the return signal that is reflected from substrate 206.

Figure 3A:
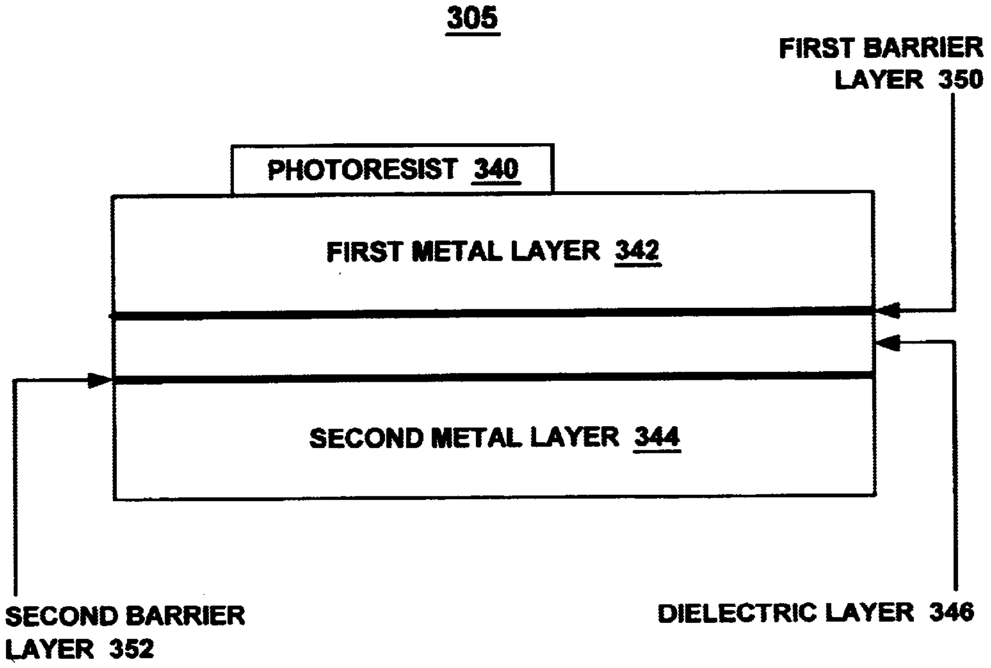
FIGS. 3A, 3B, 3C, 3D, 3E and 3F illustrate various stages of a process for fabricating a metal-insulator-metal (MIM) capacitor in accordance with one embodiment of the present invention.

FIGS. 3A, 3B, 3C, 3D, 3E and 3F illustrate various stages of a process for fabricating a MIM capacitor in accordance with one embodiment of the present invention. With reference first to FIG. 3A, a structure 305 (e.g., a laminate) is either formed on or received by stepper 100 of FIGS. 1 and 2 (as described above, embodiments of the present invention may be implemented on devices other than steppers, such as scanners). The structure 305 is located (sits on top of) wafer 130 (FIG. 1) or substrate 206 (FIG. 2), for example.

In this embodiment, structure 305 includes a first metal layer 342, a first barrier layer 350, a dielectric layer 346, a second barrier layer 352, and a second metal layer 344. Photoresist 340 is applied to first metal layer 342 in a particular pattern using a known photolithography technique, such as that illustrated by FIG. 1. In the present embodiment, the first metal layer 342 and the second metal layer 344 are comprised of aluminum, the dielectric layer 346 is comprised of a high-k dielectric such as silicon nitrite or silicon-oxy-nitrite, and the first barrier layer 350 and the second barrier layer 352 are comprised of Ti-nitrite (TiN). However, it is appreciated that these elements may be made of other types of materials.

Figure 3B:
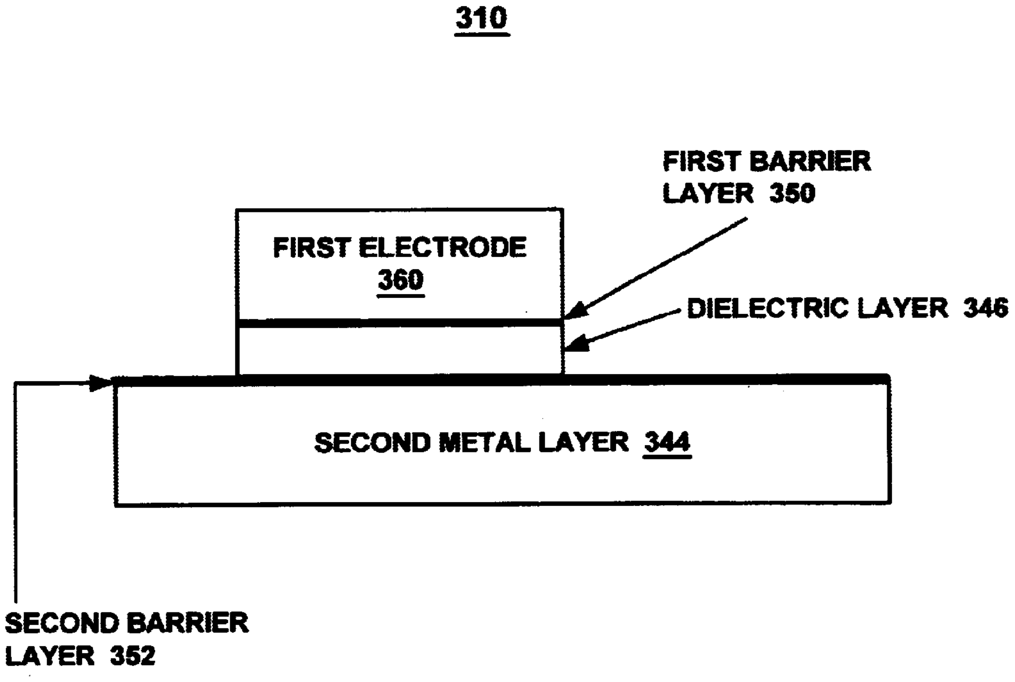

With reference to FIG. 3B, a known etching process is used to remove the portions of first metal layer 342 (FIG. 3A), first barrier layer 350 and dielectric layer 346 that are not underlying photoresist 340 (FIG. 3A). That is, in this embodiment, the etching process removes material up to second barrier layer 352 to form first electrode 360 with underlying first barrier layer 350 and dielectric layer 346.

Figure 3C:
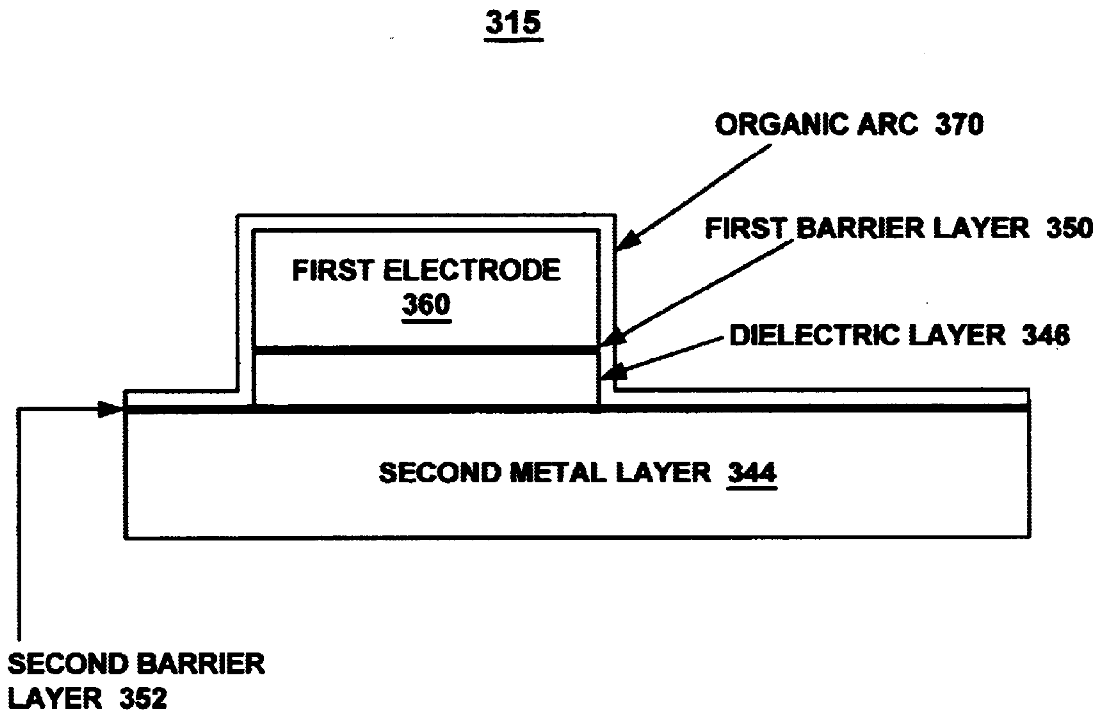

Now with reference to FIG. 3C, in accordance with the present embodiment of the present invention, organic anti-reflective coating (ARC) 370 is applied to first electrode 360 and to the surfaces of structure 315 (e.g., the surfaces of second barrier layer 352) that are exposed by the etching process. The organic ARC 370 functions to reduce reflection from the structure 315, allowing the stepper 100 (FIGS. 1 and 2) to more accurately acquire the marks that are used to align the stepper 100 and the target (e.g., structure 315). Accordingly, the components that make up the finished MIM capacitor will be accurately positioned and formed.

According to the present invention, different types or brands of organic ARC can be used. One factor to consider when selecting an organic ARC to be used is the thickness to be applied, which in turn is dependent on the optimum process conditions associated with the lithography (e.g., photolithography) technique being employed. In one embodiment, the organic ARC 370 is AR2, and in another embodiment, the organic ARC 370 is AR3. These or other types of organic ARC can be used interchangeably depending, for instance, on the factors described above.

Figure 3D:
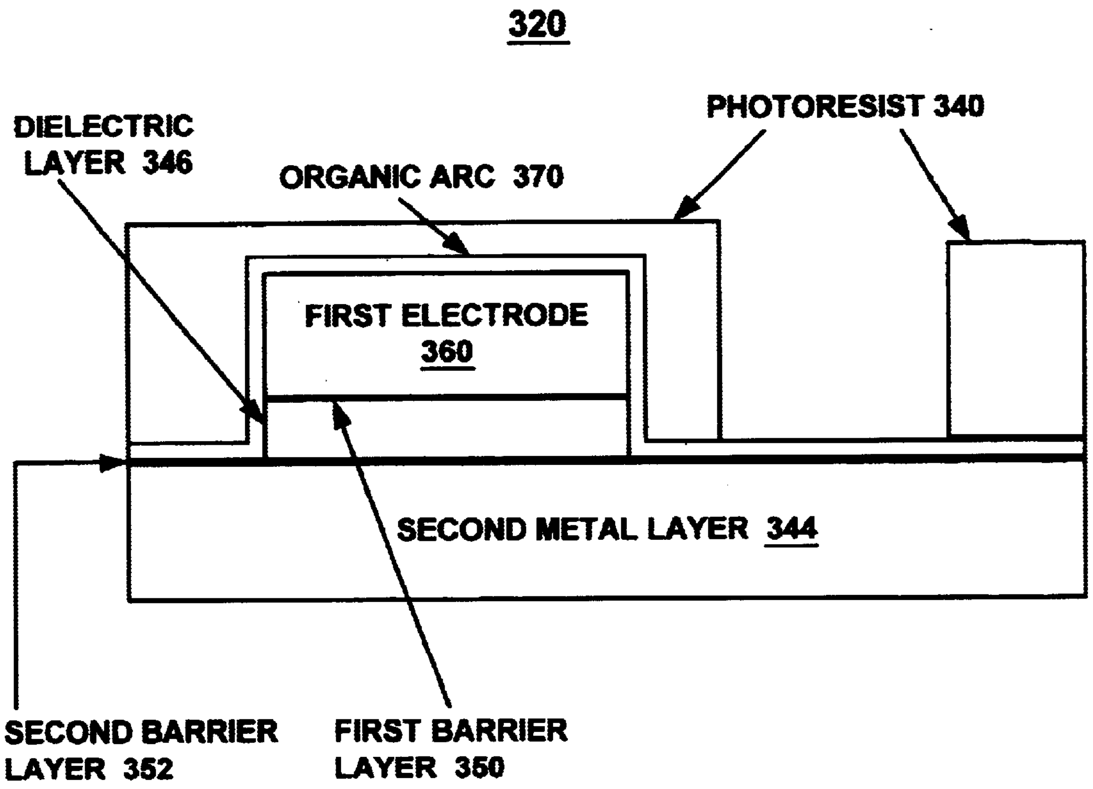
Figure 3E:
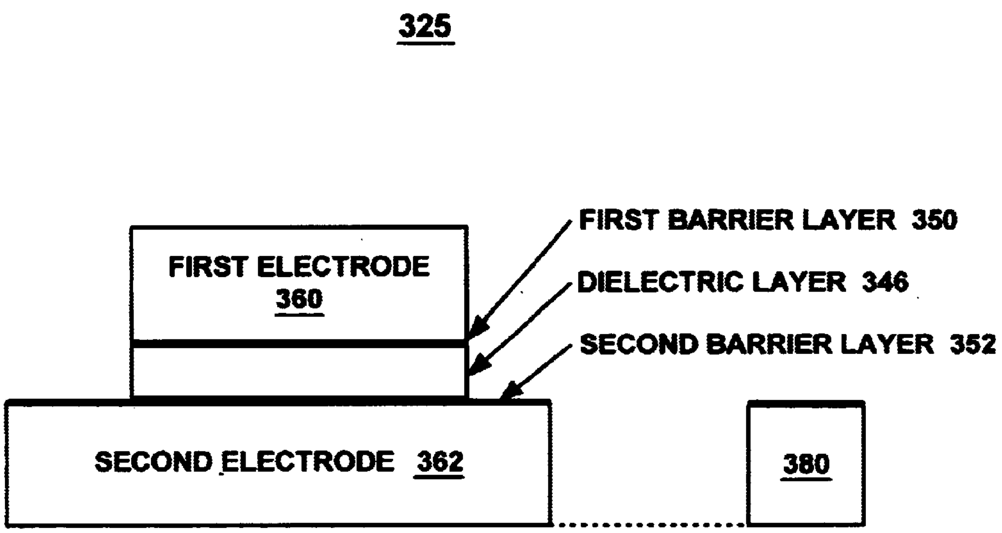

With reference next to FIG. 3D, photoresist 340 is applied to structure 320. In FIG. 3E, a known etching process is used to remove the portions of second metal layer 342 (FIG. 3D) and second barrier layer 352 that are not underlying photoresist 340 (FIG. 3D). That is, in this embodiment, the etching process removes material up to the underlying substrate to form second electrode 362. A component 380 also formed in the etching process is shown.

Figure 3F:
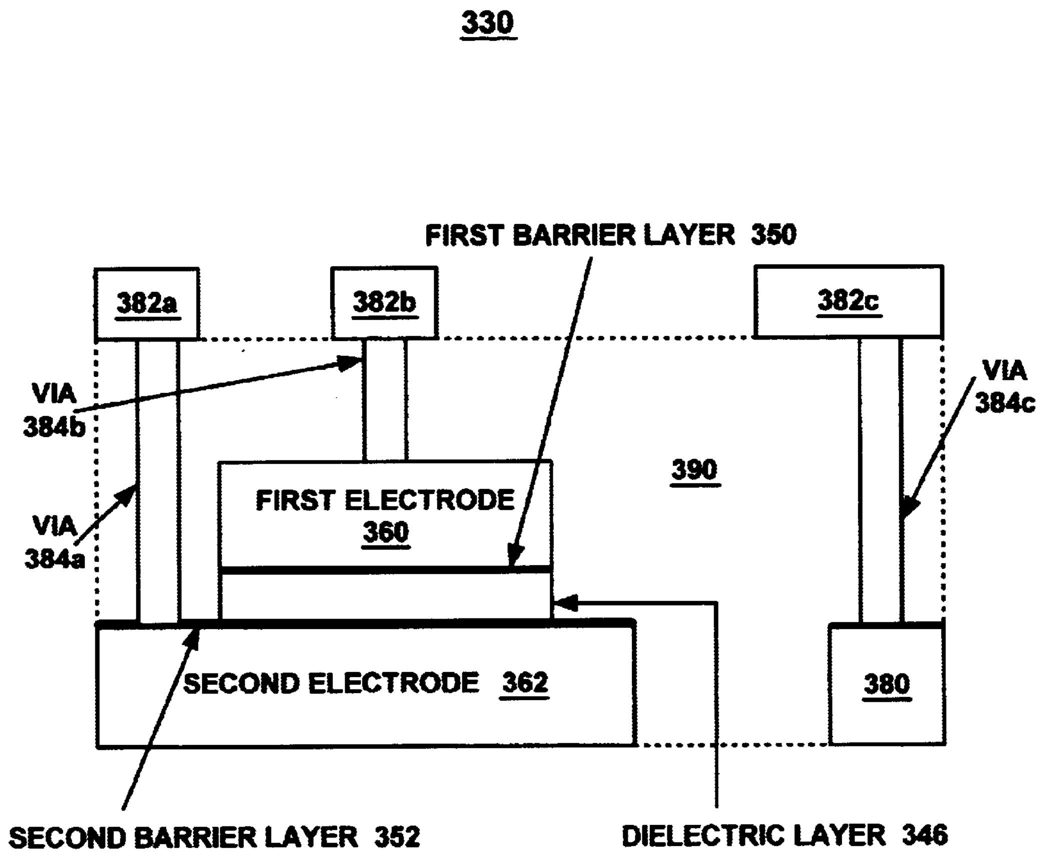

Now with reference to FIG. 3F, structure 330 comprising a MIM capacitor and other components is shown. The second electrode 362 is coupled to line 382*a* through region 390 by via 384*a*, first electrode 360 is similarly coupled to line 382*b* by via 384*b*, and component 380 is coupled to line 382*c* by via 384*c*. Region 390 may comprise deposited low-k material such as silicon-dioxide ($SiO_2$), SOG (spin on glass), USG (undoped spin on glass), or other types of material used in the fabrication of MIM capacitors.

Significantly, in accordance with the present invention, organic ARC 370 is removed using, for example, a known nominal cleaning technique. As a result, the MIM capacitor fabricated in accordance with the present invention does not incorporate ARC, thereby improving the electrical performance of the MIM capacitor. Specifically, in accordance with the present invention, breakdown voltage is increased and leakage current is decreased. Furthermore, the variation in these parameters is reduced; that is, the range of values associated with these parameters fits within a tighter tolerance. For example, the breakdown voltage for a MIM capacitor fabricated according to the present invention increases to 40–43 volts.

It is appreciated that, in another embodiment, organic ARC 370 can be applied to first metal layer 342 of FIG. 3A, prior to forming first electrode 360 of FIG. 3B, and then removed (cleaned).

Figure 4:
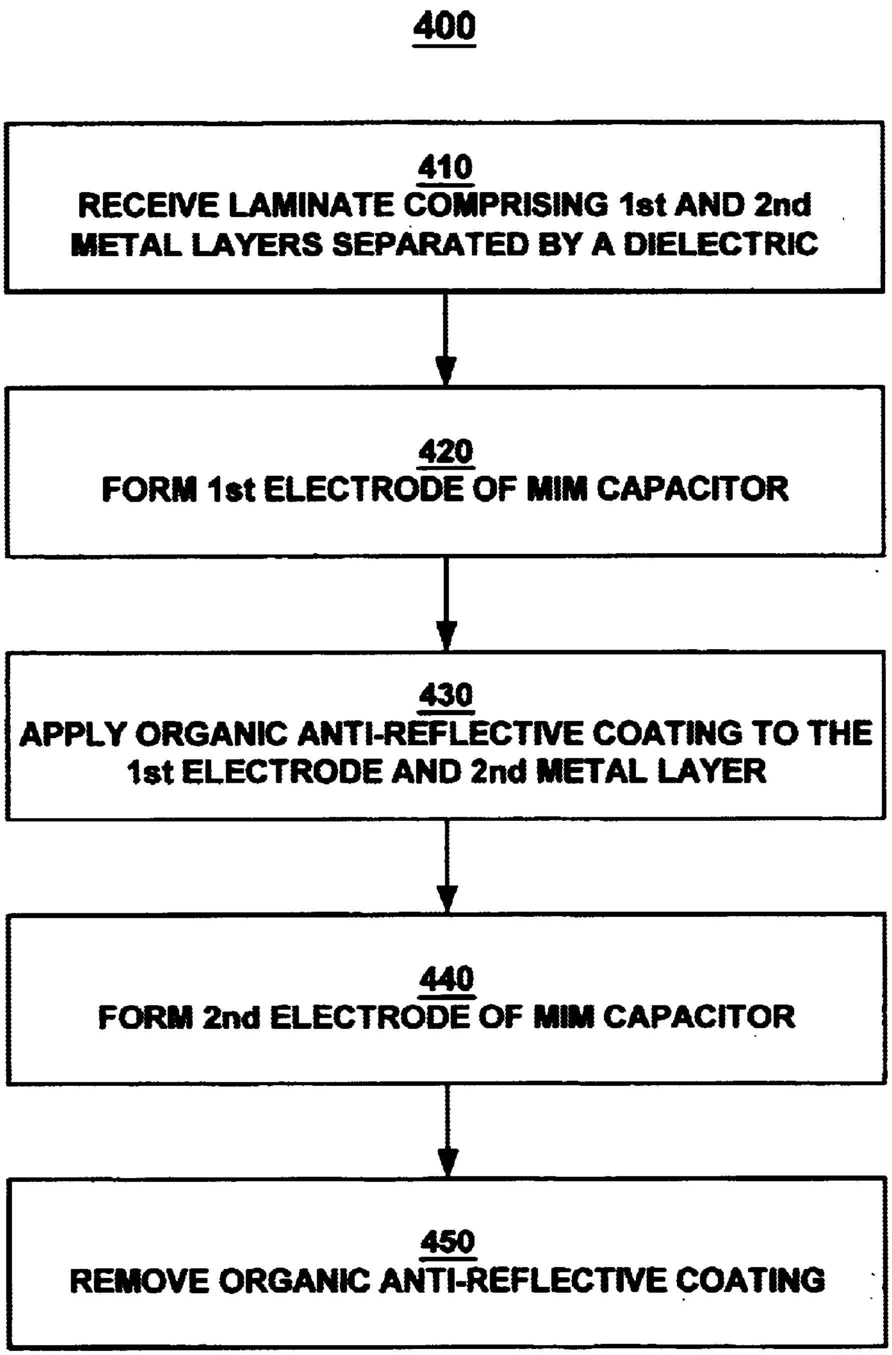
FIG. 4 is a flowchart of the steps in a process for fabricating a MIM capacitor in accordance with the process of FIGS. 3A–3F.

FIG. 4 is a flowchart of the steps in a process 400 for fabricating a MIM capacitor in accordance with the process of FIGS. 3A–3F. In step 410, a laminate such as structure 305 of FIG. 3A is received by, or formed on, stepper 100 (FIGS. 1 and 2). A photoresist 340 is applied to the laminate.

In step 420 of FIG. 4, with reference to FIGS. 3A and 3B, a first electrode 360 is formed by removing at least a portion of the material not underlying photoresist 340. In one embodiment, an organic ARC (e.g., organic ARC 370 of FIG. 3C) is applied to first metal layer 342 prior to formation of first electrode 360.

In step 430 of FIG. 4, with reference also to FIGS. 3C and 3D, organic ARC 370 is applied to first electrode 360 as well as to the surfaces of structures 315 and 320 that were exposed when first electrode 360 was formed in step 420.

In step 440 of FIG. 4, with reference to FIG. 3E, second electrode 362 is formed by removing the material not underlying photoresist 340 of FIG. 3D.

In step 450 of FIG. 4, in accordance with the present invention, the organic ARC 370 (FIGS. 3C and 3D) is removed using, for example, a nominal cleaning technique.

FIGS. 5A, 5B, 5C, 5D and 5E illustrate various stages of a process for fabricating a MIM capacitor in accordance with another embodiment of the present invention. This embodiment differs from the embodiment of FIGS. 3A–3F in the order in which the electrodes of the MIM capacitor are formed. Relatively speaking, in the process of FIGS. 3A–3F, the first electrode is formed from the top metal layer, while in the process of FIGS. 5A–5E, the first electrode is formed from the bottom metal layer.

Figure 5A:
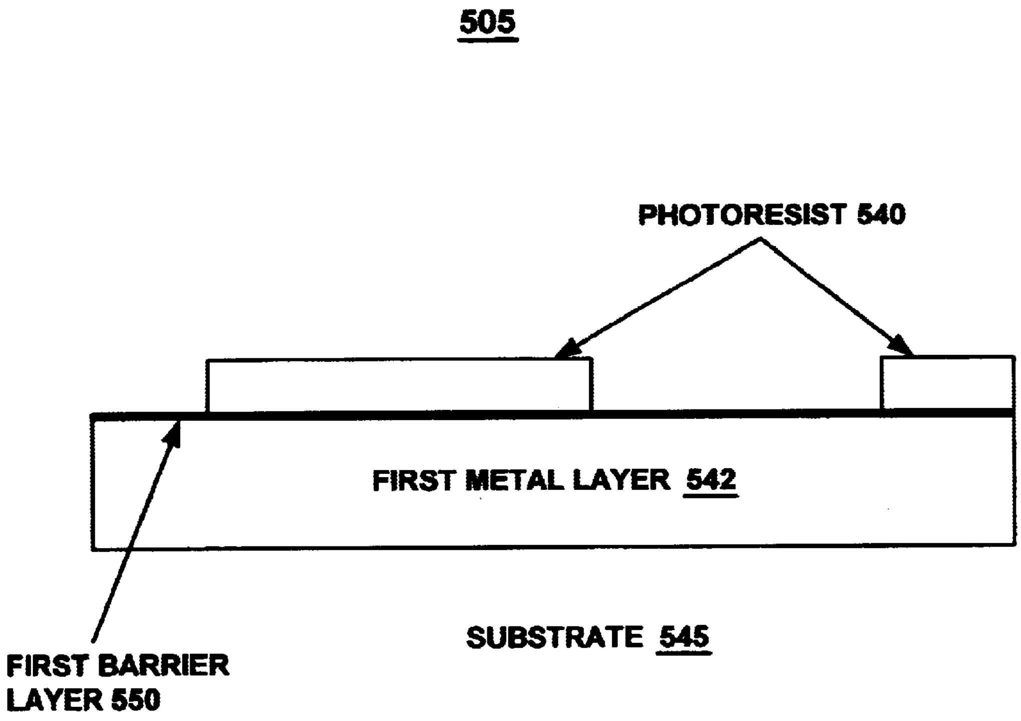
FIGS. 5A, 5B, 5C, 5D and 5E illustrate various stages of a process for fabricating a MIM capacitor in accordance with another embodiment of the present invention.

With reference to FIG. 5A, in the present embodiment, a first metal layer 542 and a first barrier layer 550 are deposited on some type of substrate 545. As described in conjunction with FIG. 1 above, substrate 545 may be a wafer 130, a passivation layer that has been deposited on the wafer 130, another type of layer deposited on the wafer 130, another component or device built on the wafer 130, or some other type of substrate residing on wafer 130.

Photoresist 540 is applied to first metal layer 542 in a particular pattern using a known photolithography technique, such as that illustrated by FIG. 1. In the present embodiment, the first metal layer 542 is comprised of aluminum, and the first barrier layer 550 is comprised of Ti-nitrite (TiN). However, it is appreciated that these elements may be made of other types of materials.

Figure 5B:
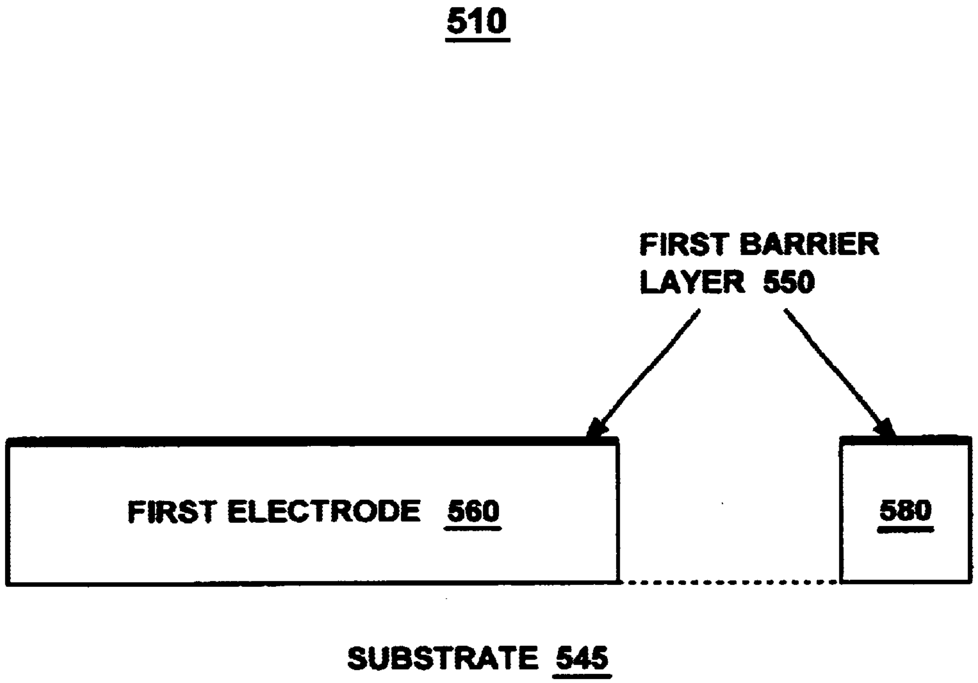

With reference next to FIG. 5B, a known etching process is used to remove the portions of first metal layer 542 (FIG. 5A) and first barrier layer 550 that are not underlying photoresist 540 (FIG. 5A). That is, in this embodiment, the etching process removes material up to substrate 545 to form first electrode 560. Another component 580 formed in the etching process is also shown.

Figure 5C:
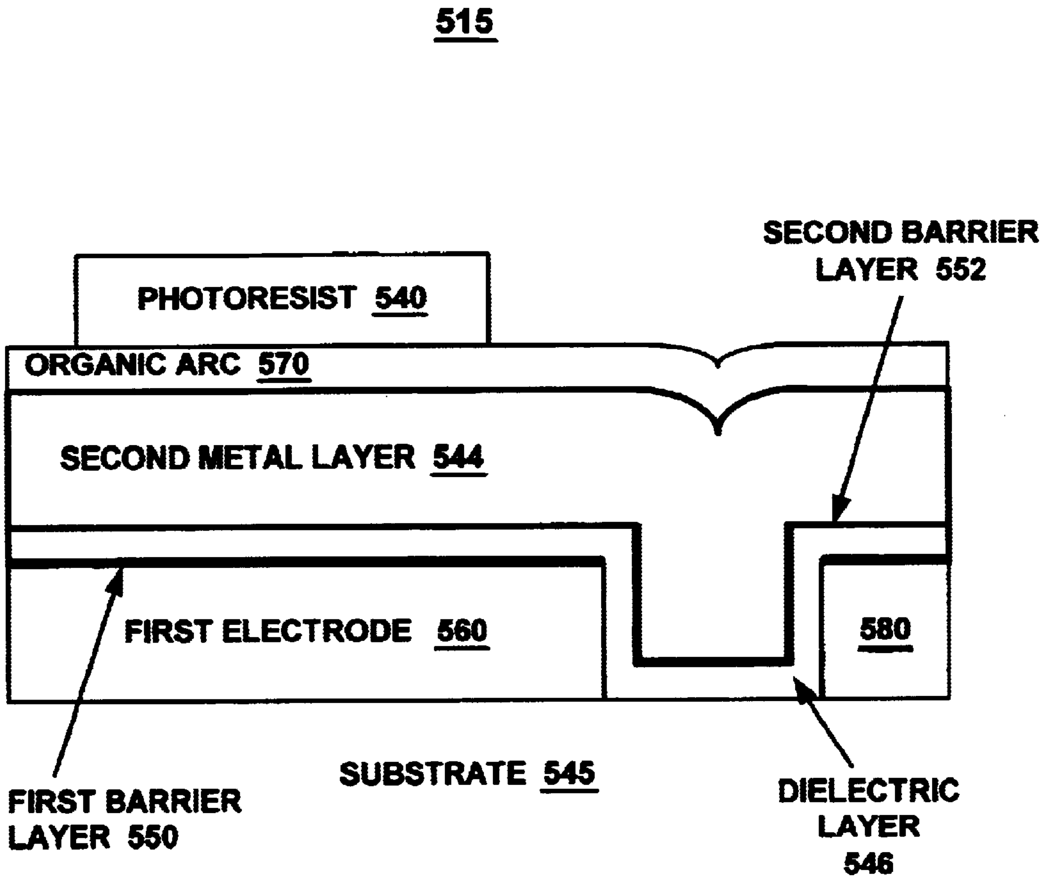

Now with reference to FIG. 5C, a dielectric layer 546 is deposited over first barrier layer 550 (first electrode 560 and component 580), a second barrier layer 552 is deposited over dielectric layer 546, and a second metal layer 544 is deposited over second barrier layer 552. In accordance with the present embodiment of the present invention, organic anti-reflective coating (ARC) 570 is applied to second metal layer 544. Photoresist 540 is also applied to structure 515.

The organic ARC 570 functions to reduce reflection from the structure 515, allowing the stepper 100 (FIGS. 1 and 2) to more accurately acquire the marks that are used to align the stepper 100 and the target (e.g., structure 515). Accordingly, the components that make up the finished MIM capacitor will be accurately positioned and formed. In one embodiment, the organic ARC 570 is AR2, and in another embodiment, the organic ARC 570 is AR3.

Figure 5D:
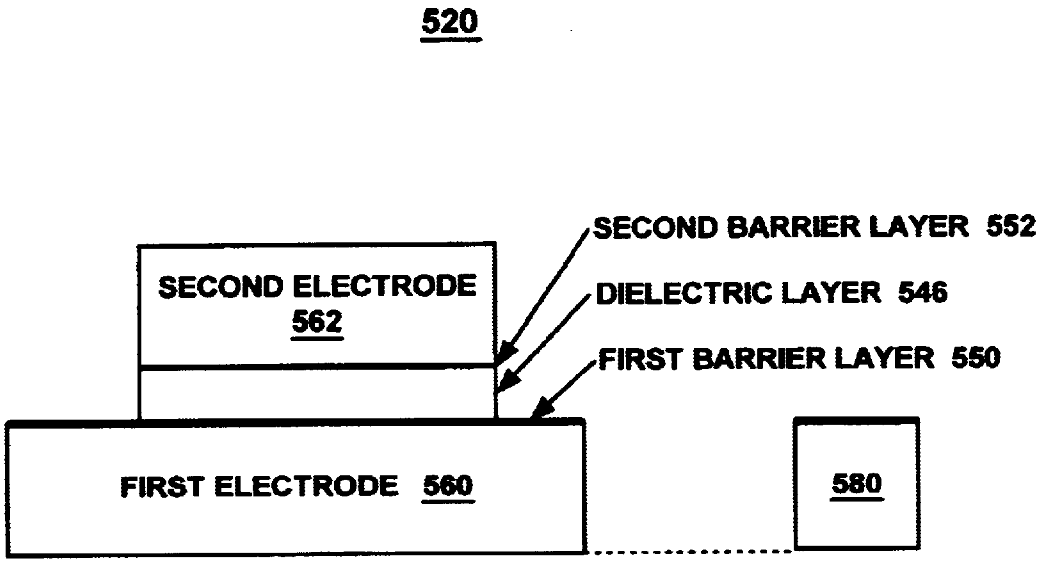

In FIG. 5D, a known etching process is used to remove the portions of second metal layer 544 (FIG. 5C), second barrier layer 552, and dielectric layer 546 that are not underlying photoresist 540 (FIG. 5C). That is, in this embodiment, the etching process removes material up to the underlying first barrier layer 550 to form second electrode 562. Second electrode 562 is separated from first electrode 560 by second barrier layer 552, dielectric layer 546, and first barrier layer 550.

Significantly, in accordance with the present invention, organic ARC 570 is removed using, for example, a known nominal cleaning technique. As a result, the MIM capacitor fabricated in accordance with the present invention does not incorporate ARC, thereby improving the electrical performance of the MIM capacitor. Specifically, in accordance with the present invention, breakdown voltage is increased and leakage current is decreased. Furthermore, the variation in these parameters is reduced; that is, the range of values associated with these parameters fits within a tighter tolerance.

Figure 5E:
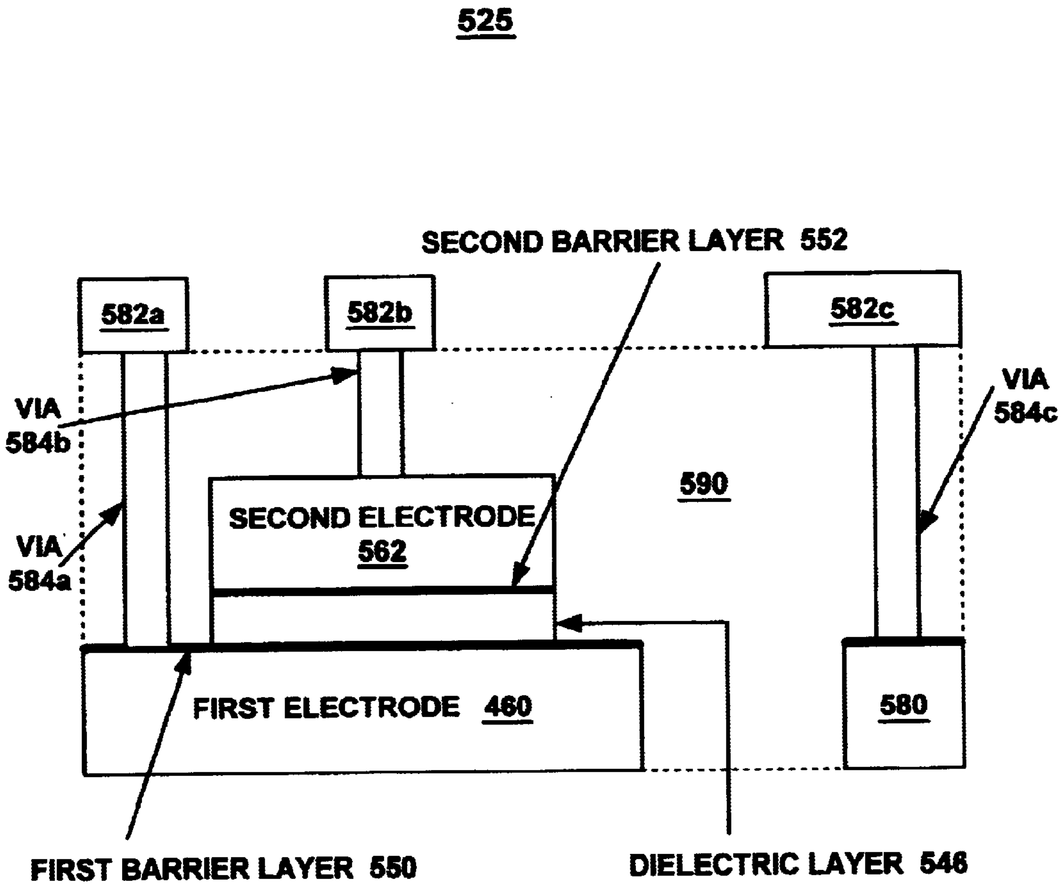

Now with reference to FIG. 5E, structure 525 comprising a MIM capacitor and other components is shown. The second electrode 562 is coupled to line 582*b* through region 590 by via 584*b*, first electrode 560 is similarly coupled to line 582*a* by via 584*a*, and component 580 is coupled to line 582*c* by via 584*c*. Region 590 may comprise deposited material such as $SiO_2$ or other types of low-k materials used in the fabrication of an inter-metal dielectric layer (IMD).

It is appreciated that, in another embodiment, organic ARC 570 can be applied to first metal layer 542 of FIG. 5A, prior to forming first electrode 560 of FIG. 5B, and then removed (cleaned).

Figure 6:
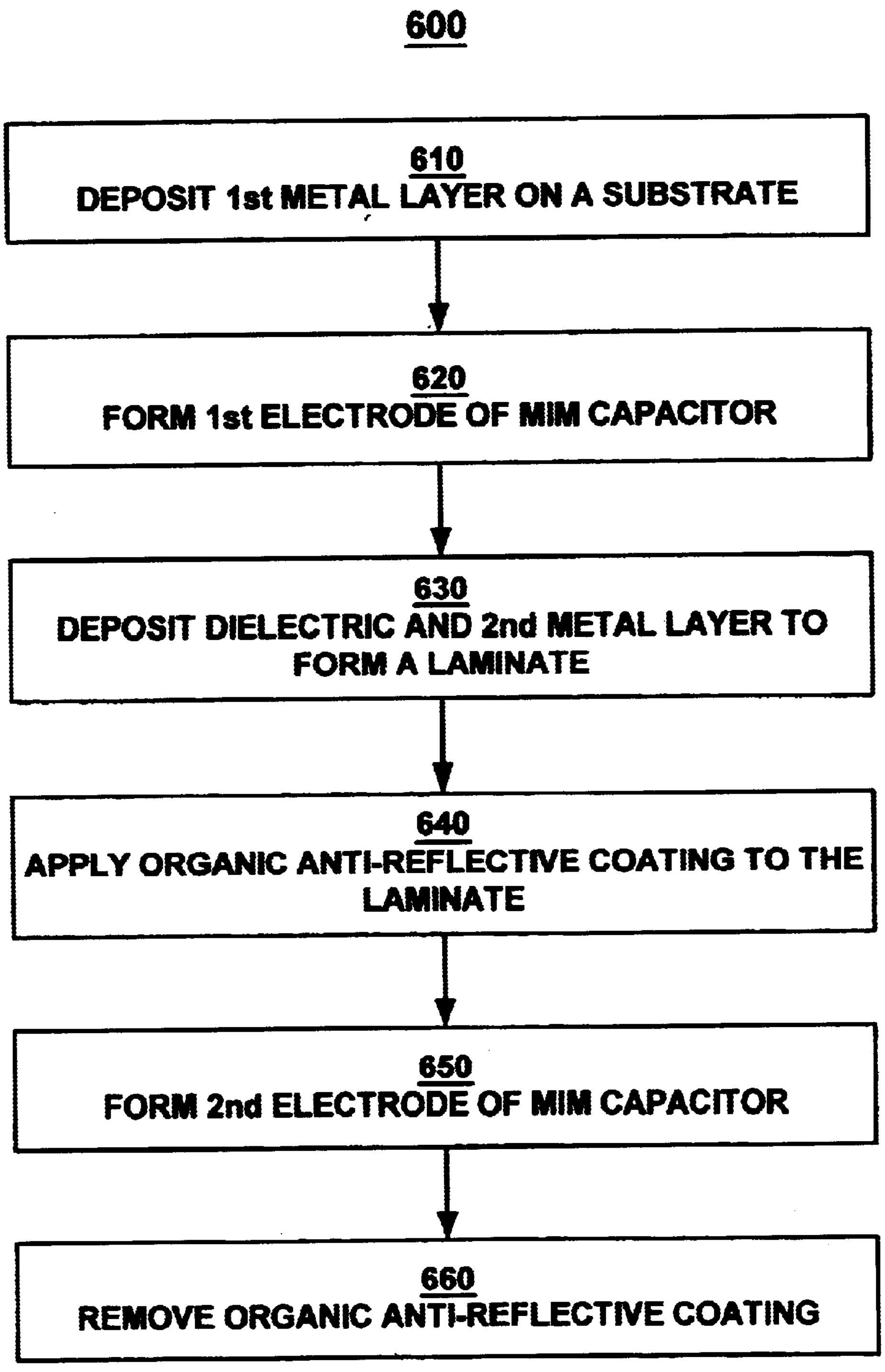
FIG. 6 is a flowchart of the steps in a process for fabricating a MIM capacitor in accordance with the process of FIGS. 5A–5E.

FIG. 6 is a flowchart of the steps in a process 600 for fabricating a MIM capacitor in accordance with the process of FIGS. 5A–5E. In step 610, with reference also to FIG. 5A, first metal layer 542 is deposited on a substrate 545. In one embodiment, first barrier layer 550 is also deposited on first metal layer 542. A photoresist 540 is also applied.

In step 620 of FIG. 6, with reference also to FIG. 5B, a first electrode 560 is formed by removing the material (the portion of first metal layer 542) not underlying photoresist 540. In one embodiment, an organic ARC (e.g., organic ARC 570 of FIG. 5C) is applied to first metal layer 542 prior to formation of first electrode 560. Other components such as component 580 can also be formed.

In step 630 of FIG. 6, with reference also to FIG. 5C, a dielectric layer 546 and a second metal layer 544 are deposited to form a laminate such as structure 515. In one embodiment, a second barrier layer 552 is also deposited between second metal layer 544 and dielectric layer 546.

In step 640 of FIG. 6, with reference again to FIG. 5C, in accordance with the present invention, organic ARC 570 is applied. A photoresist 540 is then also applied.

In step 650 of FIG. 6, with reference to FIG. 5D as well, second electrode 562 is formed by removing the materials (e.g., portions of second metal layer 544, second barrier layer 552, and dielectric layer 546) not underlying photoresist 540 (FIG. 5C).

In step 660 of FIG. 6, in accordance with the present invention, the organic ARC 570 (FIG. 5C) is removed using, for example, a nominal cleaning technique.

Figure 7A:
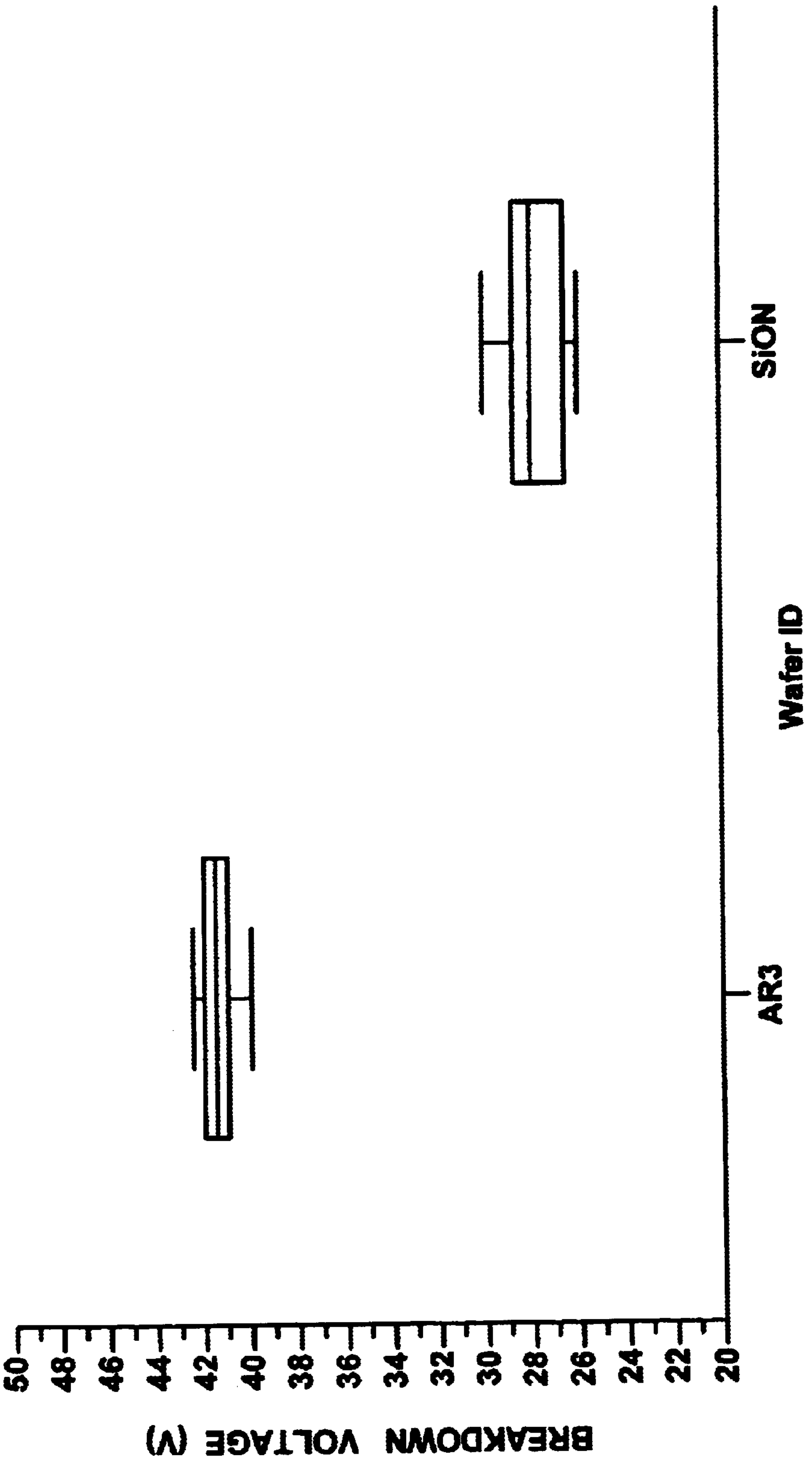
FIG. 7A compares breakdown voltage for a MIM capacitor fabricated in accordance with one embodiment of the present invention versus breakdown voltage for a MIM capacitor fabricated according to the prior art.
Figure 7B:
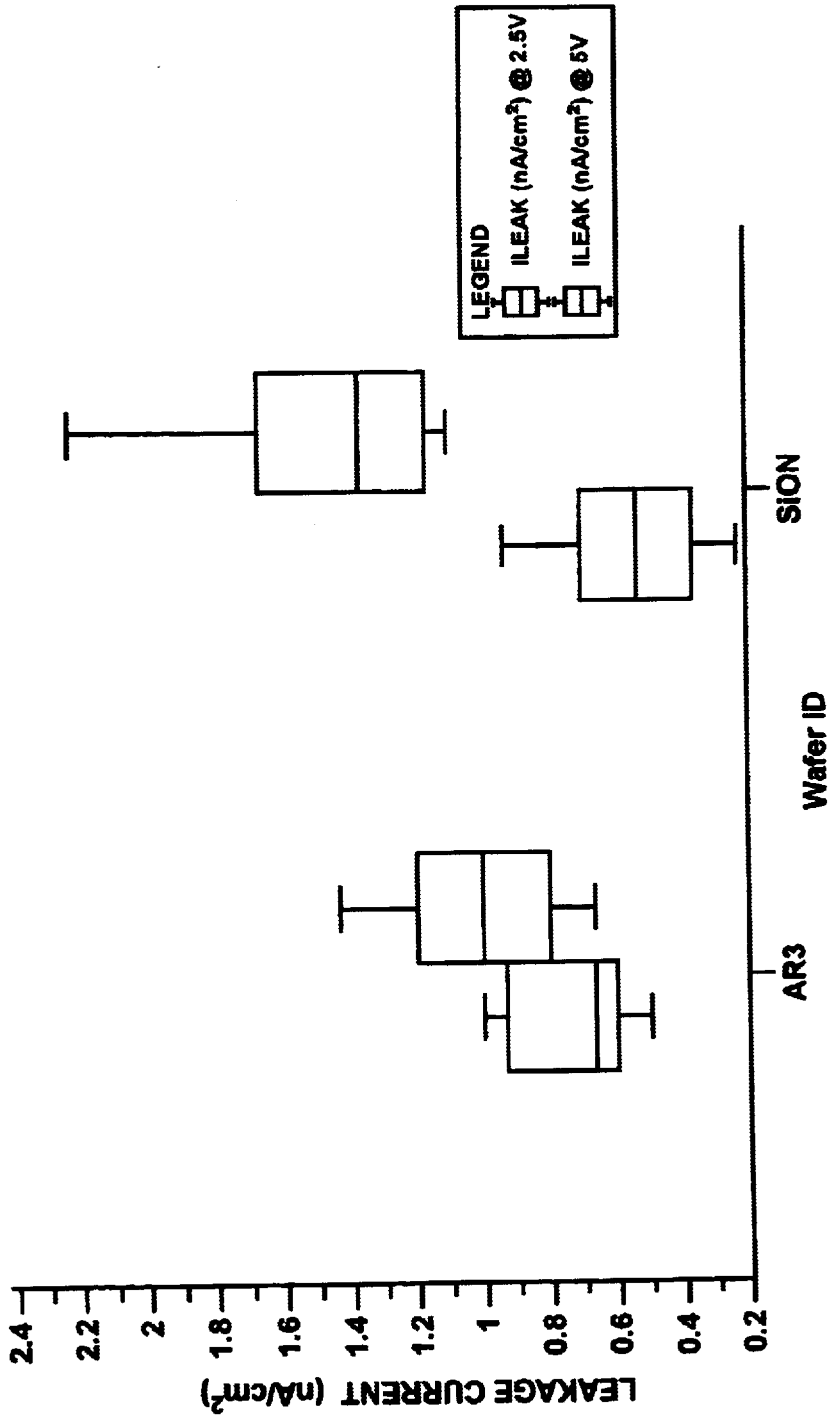
FIG. 7B compares leakage current for a MIM capacitor fabricated in accordance with one embodiment of the present invention versus leakage current for a MIM capacitor fabricated according to the prior art.

FIGS. 7A and 7B compares breakdown voltage and leakage current, respectively, for a MIM capacitor fabricated in accordance with one embodiment of the present invention versus a MIM capacitor fabricated according to the prior art. FIG. 7A shows that the breakdown voltage for a MIM capacitor fabricated in accordance with the present invention increases and is more tightly controlled when the organic ARC is removed. FIG. 7B shows that the leakage current for a MIM capacitor fabricated in accordance with the present invention can decrease and is more tightly controlled when the organic ARC is removed.

The present invention thus provides methods and systems thereof that can be used for fabricating MIM capacitors with improved electrical performance. For example, MIM capacitors fabricated according to the present invention have higher breakdown voltages and reduced leakage currents, and these parameters can also be controlled within a tighter tolerance band.

The preferred embodiment of the present invention, method for forming a MIM capacitor, is thus described. While the present invention has been described in particular embodiments, it should be appreciated that the present invention should not be construed as limited by such embodiments, but rather construed according to the following claims.

What is claimed is:

1. A method of fabricating a metal-insulator-metal (MIM) capacitor, said method comprising the steps of:

a) receiving a laminate comprising in order a first metal layer, a first barrier layer, a dielectric layer, a second barrier layer, and a second metal layer;

b) removing a portion of said first metal layer, a portion of said first barrier layer, and a portion of said dielectric layer to form a first electrode of said MIM capacitor, leaving a portion of said second barrier layer exposed;

c) applying an anti-reflective coating to said first electrode and to said portion of said second barrier layer that is exposed, wherein said ARC is an organic ARC;

d) removing a portion of said second barrier layer and a portion of said second metal layer to form a second electrode of said MIM capacitor; and e) removing organic ARC remaining after said step d) is performed.

2. The method as recited in claim 1 further comprising the step of:

applying an organic ARC to said laminate prior to said step b).

3. The method as recited in claim 1 wherein said organic ARC is AR2.

4. The method as recited in claim 1 wherein said organic ARC is AR3.

5. The method as recited in claim 1 wherein said first metal layer and said second metal layer are comprised of aluminum and said first barrier layer and said second barrier layer are comprised of Ti-nitrite (TiN), and wherein said dielectric layer comprises a dielectric selected from the group consisting of silicon-nitrite and silicon-oxy-nitrite.

6. The method as recited in claim 1 wherein said step b) and said step d) further comprise the steps of:

applying a photoresist to said laminate; and removing portions of said laminate not underlying said photoresist.

7. A method of fabricating a metal-insulator-metal (MIM) capacitor, said method comprising the steps of:

a) depositing a first metal layer on a substrate and a first barrier layer an said first metal layer;

b) removing a portion of said first metal layer and said first barrier layer to form a first electrode of said MIM capacitor;

c) depositing a dielectric layer on a remaining portion of said first barrier layer and an exposed area of said substrate;

d) depositing a second barrier layer on said dielectric layer;

e) depositing a second metal layer on said second barrier layer; dielectric layer to form a laminate;

f) applying an anti-reflective coating (ARC) to said second metal layer, wherein said ARC is an organic ARC;

g) removing a portion of said dielectric layer, said second barrier layer, and said second metal layer to form a second electrode of said MIM; and h) removing organic ARC remaining alter said step g) is performed.

8. The method as recited in claim 7 further comprising the step of:

applying an organic ARC to said first metal layer prior to said step b).

9. The method as recited in claim 7 wherein said organic ARC is AR2.

10. The method as recited in claim 7 wherein said organic ARC is AR3.

11. The method as recited in claim 7 wherein said first metal layer and said second metal layer are comprised of aluminum and said first barrier layer and said second barrier layer are comprised of Ti-nitrite (TiN), and wherein said dielectric layer comprises a dielectric selected from the group consisting of silicon-nitrite and silicon-oxy-nitrite.

12. The method as recited in claim 7 wherein said step b) and said step e) further comprise the steps of:

applying a photoresist to said laminate; and removing portions of said first metal layer and of said second metal layer not underlying said photoresist.

* * * * *